US010431897B1

(12) United States Patent
Xin et al.

(10) Patent No.: US 10,431,897 B1
(45) Date of Patent: Oct. 1, 2019

(54) MICROWAVE GAIN MEDIUM WITH NEGATIVE REFRACTIVE INDEX

(71) Applicant: ARIZONA BOARD OF REGENTS ON BEHALF OF THE UNIVERSITY OF ARIZONA, Tucson, AZ (US)

(72) Inventors: Hao Xin, Tucson, AZ (US); Qi Tang, Tucson, AZ (US); Adnan Kantemur, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 15/382,144

(22) Filed: Dec. 16, 2016

Related U.S. Application Data

(60) Provisional application No. 62/269,296, filed on Dec. 18, 2015.

(51) Int. Cl.
| | |
|---|---|
| *H01Q 15/08* | (2006.01) |
| *H01P 5/02* | (2006.01) |
| *H01L 27/26* | (2006.01) |

(52) U.S. Cl.
CPC .............. *H01Q 15/08* (2013.01); *H01L 27/26* (2013.01); *H01P 5/028* (2013.01)

(58) Field of Classification Search
CPC .......... H01Q 15/08; H01L 27/26; H01P 5/028
See application file for complete search history.

(56) References Cited

U.S. PATENT DOCUMENTS

| | | | |
|---|---|---|---|
| 7,683,444 B2 | 3/2010 | Tonucci | |
| 2003/0142036 A1* | 7/2003 | Wilhelm | H01Q 1/36 343/909 |
| 2006/0044212 A1* | 3/2006 | Wang | H01Q 3/44 343/911 R |

OTHER PUBLICATIONS

Pendry, J.B. Negative refraction makes a perfect lens. Phys Rev Lett 85, 3966-3969 (2000).
Schurig, D., et al. Metamaterial electromagnetic cloak at microwave frequencies. Science 314, 977-980 (2006).
Fang, A., Koschny, T. & Soukoulis, C.M. Self-consistent calculations of loss-compensated fishnet metamaterials. Phys Rev B 82, 121102-121105 (2010).
Hamm, J.M., Wuestner, S., Tsakmakidis, K.L. & Hess, O. Theory of Light Amplification in Active Fishnet Metamaterials. Phys Rev Lett 107, 167405-167409 (2011).
Hess, O., Pendry, J.B., Maier, S.A., Oulton, R.F., Hamm, J.M. & Tsakmakidis, K.L. Active nanoplasmonic metamaterials. Nat Mater 11, 573-584 (2012).
Wuestner, S., Pusch, A., Tsakmakidis, K.L., Hamm, J.M. & Hess, O. Overcoming Losses with Gain in a Negative Refractive Index Metamaterial. Phys Rev Lett 105, 127401-127404 (2010).

(Continued)

*Primary Examiner* — Daniel Munoz
(74) *Attorney, Agent, or Firm* — Nguyen Tarbet

(57) ABSTRACT

The present invention features a microwave gain medium having a negative refractive index, which overcompensates for loss exhibited in conventional passive metamaterials. The design consists of sub-wavelength building blocks with embedded microwave tunnel diodes exhibiting a negative refractive index and a stable net gain. The negative resistance may also be used for dispersion compensation that may enable broadband response of metamaterials.

6 Claims, 5 Drawing Sheets

(56) References Cited

OTHER PUBLICATIONS

Xiao, S.M., Drachev, V.P., Kildishev, A.V., Ni, X., Chettiar, U.K., Yuan, H.K. & Shalaev, V.M. Loss-free and active optical negative-index metamaterials. Nature 466, 735-U736 (2010).

Hess, O. & Tsakmakidis, K.L. Metamaterials with Quantum Gain. Science 339, 654-655 (2013).

Chen, P.Y., Argyropoulos, C. & Alu, A. Broadening the Cloaking Bandwidth with Non-Foster Metasurfaces. Phys Rev Lett 111, 233001 (2013).

Xu, W.R., Padilla, W.J. & Sonkusale, S. Loss compensation in Metamaterials through embedding of active transistor based negative differential resistance circuits. Opt Express 20, 22406-22411 (2012).

Boardman, A.D., Rapoport, Y.G., King, N. & Malnev, V.N. Creating stable gain in active metamaterials. J Opt Soc Am B 24, A53-A61 (2007).

Yuan, Y., Popa, B.I. & Cummer, S.A. Zero loss magnetic metamaterials using powered active unit cells. Opt Express 17, 16135-16143 (2009).

Stockman, M.I. Criterion for negative refraction with low optical losses from a fundamental principle of causality. Phys Rev Lett 98, 177404 (2007).

Kinsler, P. & McCall, M.W. Causality-Based Criteria for a Negative Refractive Index Must Be Used With Care. Phys Rev Lett 101, 167401 (2008).

Stockman, M.I. Stockman replies. Phys Rev Lett 107, 259702 (2011).

Pendry, J.B. & Maier, S.A. Comment on "Spaser Action, Loss Compensation, and Stability in Plasmonic Systems with Gain". Phys Rev Lett 107, 259703 (2011).

Stockman, M.I. Spaser Action, Loss Compensation, and Stability in Plasmonic Systems with Gain. Phys Rev Lett 106, 156802 (2011).

Wuestner, S., Pusch, A., Tsakmakidis, K.L., Hamm, J.M. & Hess, O. Comment on "Spaser Action, Loss Compensation, and Stability in Plasmonic Systems with Gain". Phys Rev Lett 107, 259701 (2011).

Capua, A., Karni, O., Eisenstein, G., Reithmaier, J.P. & Yvind, K. Extreme nonlinearities in InAs/InP nanowire gain media: the two-photon induced laser. Opt Express 20, 5987-5992 (2012).

Kemp, A.J., MacLean, A.J., Hopkins, J.M., Hastie, J.E., Calvez, S., Dawson, M.D. & Burns, D. Thermal management in disc lasers: doped-dielectric and semiconductor laser gain media in thin-disc and microchip formats. J Mod Optic 54, 1669-1676 (2007).

Paschotta, R. Laser Gain Media: A Diverse Family of Materials. Photonic Spectra 47, 57-60 (2013).

Pirri, A., Toci, G. & Vannini, M. Characterization and comparison of 1% at Yb-doped Lu2O3 and Sc2O3 ceramics as laser gain media. Laser Phys 22, 1851-1855 (2012).

Tanaka, M., Nishikino, M., Kawachi, T., Hasegawa, N., Kado, M., Kishimoto, M., Nagashima, K. & Kato, Y. X-ray laser beam with diffraction-limited divergence generated with two gain media. Opt Lett 28, 1680-1682 (2003).

Jiang, T., Chang, K.H., Si, L.M., Ran, L.X. & Xin, H. Active Microwave Negative-Index Metamaterial Transmission Line with Gain. Phys Rev Lett 107, 205503-205507 (2011).

Ye, D.; Chang, K.; Ran, L.; & Xin H. Microwave gain medium with negative refractive index. Nature Communications | DOI: 10.1038/ncomms6841 (2014).

* cited by examiner

MICROWAVE GAIN MEDIUM WITH NEGATIVE REFRACTIVE INDEX

CROSS REFERENCE

This application claims priority to U.S. Patent Application No. 62/269,296, filed Dec. 18, 2015, the specification(s) of which is/are incorporated herein in their entirety by reference.

GOVERNMENT SUPPORT

This invention was made with government support under Grant No. FA9550-13-1-0209 awarded by USAF/AFOSR. The government has certain rights in the invention.

FIELD OF THE INVENTION

The present invention relates to overcoming critical challenges faced by metamaterial technology when utilized in practical applications. More specifically, a microwave gain medium having a negative resistance was designed to effectively overcompensate for loss exhibited by conventional passive metamaterials.

BACKGROUND OF THE INVENTION

Material containing both a negative electric permittivity and magnetic permeability (at a given frequency) exhibit a negative index of refraction. These materials are referred to as left handed materials (LHM) or negative index materials (NIM) and have an ability to re-focus light passing through them. Scientific literature describing thin wires and split-ring resonators (SRRs) paved the way for the fabrication of metamaterials exhibiting negative index properties at microwave frequencies, Scientific literature has also disclosed the use of an array of thin metal wires to enable plasma frequency of a metal to be shifted predictably to microwave frequencies. Further, it has been disclosed that the permeability of a metamaterial can be made negative using an array of non-magnetic coupled metallic SRRs. This ability was demonstrated in the microwave range by D Smith, et. al., Phys, Rev. Lett., 84 4184 (2000), and more recently in the 100 terahertz range by Linden, in S. Linden, et. al., Science, 306, 1351 (2004). In these fixed frequency structures, the size and spacing of the individual components comprising the metamaterial were assumed much smaller than the wavelength of the resonant frequency of operation.

Smith's NIM structure used SRR and strip lines made of copper over circuit board material and were fount to be functional at single narrow band frequencies only. However, these structures demonstrated that microwave radiation passing through the wedged shaped NIM is bent through a large negative angle, obeying Snell's Law, $n_1*\sin(\theta_1) = n_2*\sin(\theta_2)$. Since $n_2$ is negative, $\sin(\theta_2)$ is also negative, which yields a large change in the angle.

Artificial effective media are attractive because of applications such as super lens and electromagnetic invisibility[1,2]. However, the inevitable loss due to a strong dispersive nature is one of the fundamental challenges preventing such applications from becoming reality. Recently, the discussions of incorporating active elements into artificial media to compensate loss and potentially bandwidth have attracted more and more interests[3-12]. However, controversies concerning causality of artificial active media persist.

Prior to the present invention, the theory of the impossibility of constructing an artificial material having a negative refractive index (NRI) and net gain[13-18] was widely accepted. In optics, a diverse family of "gain media", primarily based on doped crystalline, semiconductors, dyes and gases, have been widely used in laser technologies[19-23]. Simulations have shown that placing optical gain media (i.e., optically pumped laser dyes) in fishnet metamaterial cells results in optical "gain metamaterial" able to exhibit a NRI in a narrow bandwidth without violating causality[4,7]. The significance of this conception is, while this artificial gain medium still functions as a laser amplifier, it compensates (or, potentially over-compensates) for the intrinsic loss found in traditional metamaterials. This artificial gain medium inherits the theoretical superiorities of metamaterials, (i.e., the ability to provide arbitrarily controlled constitutive parameters not found in nature[5]). Thus, "gain metamaterials" have the realistic potential in implementing metamaterial applications (e.g. perfect lenses), where intrinsic losses fundamentally plague their realizations. However, although significant loss compensation for a fishnet metamaterial at optical frequency has been reported[8], volumetric metamaterial with negative refractive index and gain has not been reported.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

Incorporating active constituents with gain into metamaterials has been recognized as a promising technique for compensating losses. Optics researchers have reported gain-assisted active metamaterials designed to alleviate material loss via stimulated emission and optical parametric amplification. In the longer wavelength microwave regime, metamaterial structures incorporating amplifiers to reduce loss have been reported. However, the gain medium of the present invention is the only experimental demonstration of a negative index structure (NIM; both 1-D and volumetric structures) exhibiting a net gain utilizing negative differential resistance via tunneling diodes.

Typical metamaterials exhibit a negative refractive index, however, waves passing through these media undergo significant energy loss. The present invention has demonstrated that integrating negative-resistance devices into typical metamaterial produces a metamaterial having a uniform spatial distribution of negative resistance. This distribution allows the metamaterial to maintain a refractive negative index while having a net gain, thereby eliminating the energy loss currently exhibited in metamaterials.

DETAILED DESCRIPTION OF EMBODIMENTS

Figure 1:
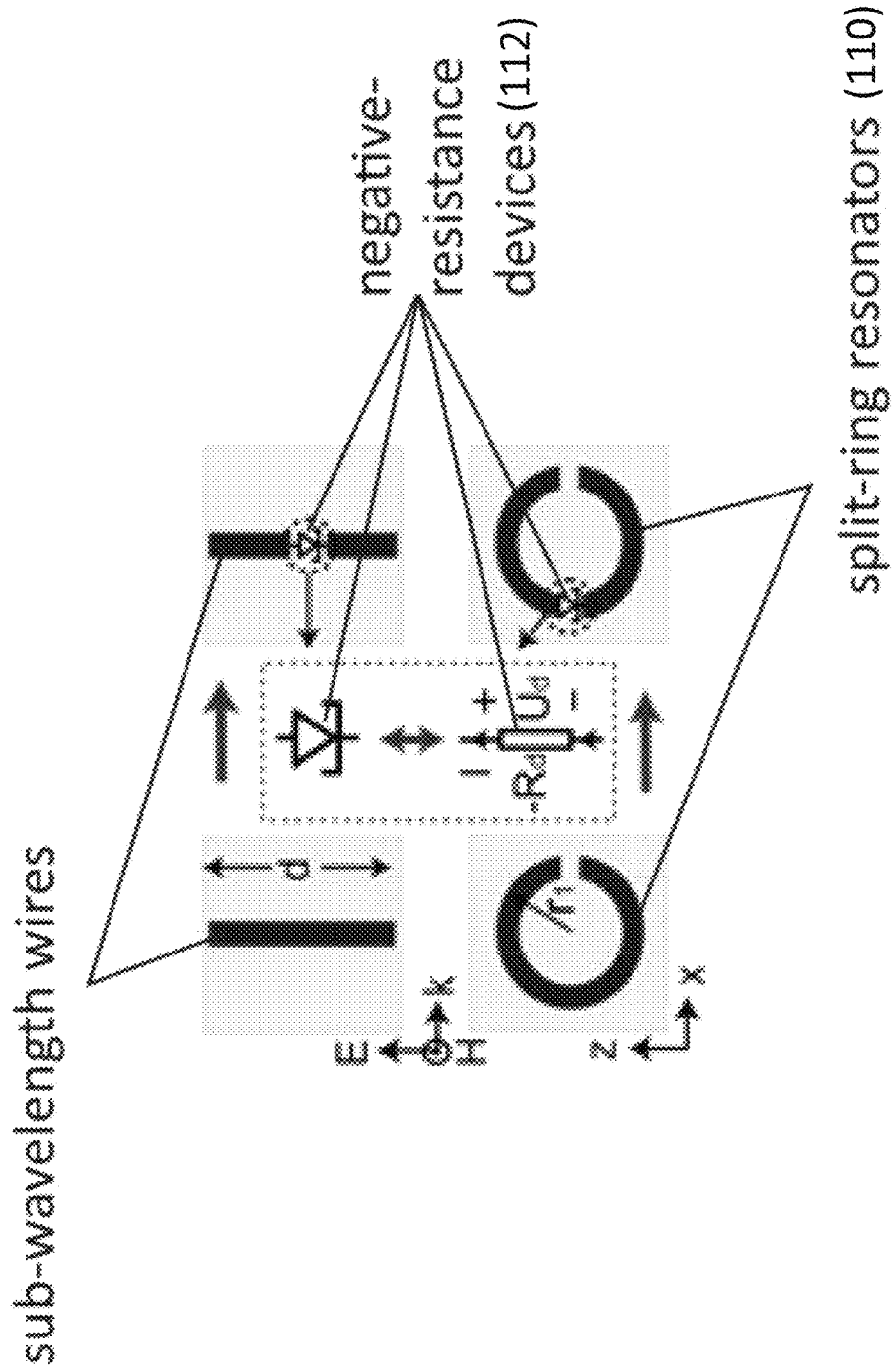
FIG. 1 shows a schematic diagram of embedding tunneling diodes in sub-wavelength metallic wire and SRR to achieve building blocks of gain materials, where the TD is equivalent to a negative-resistance device.
Figure 2:
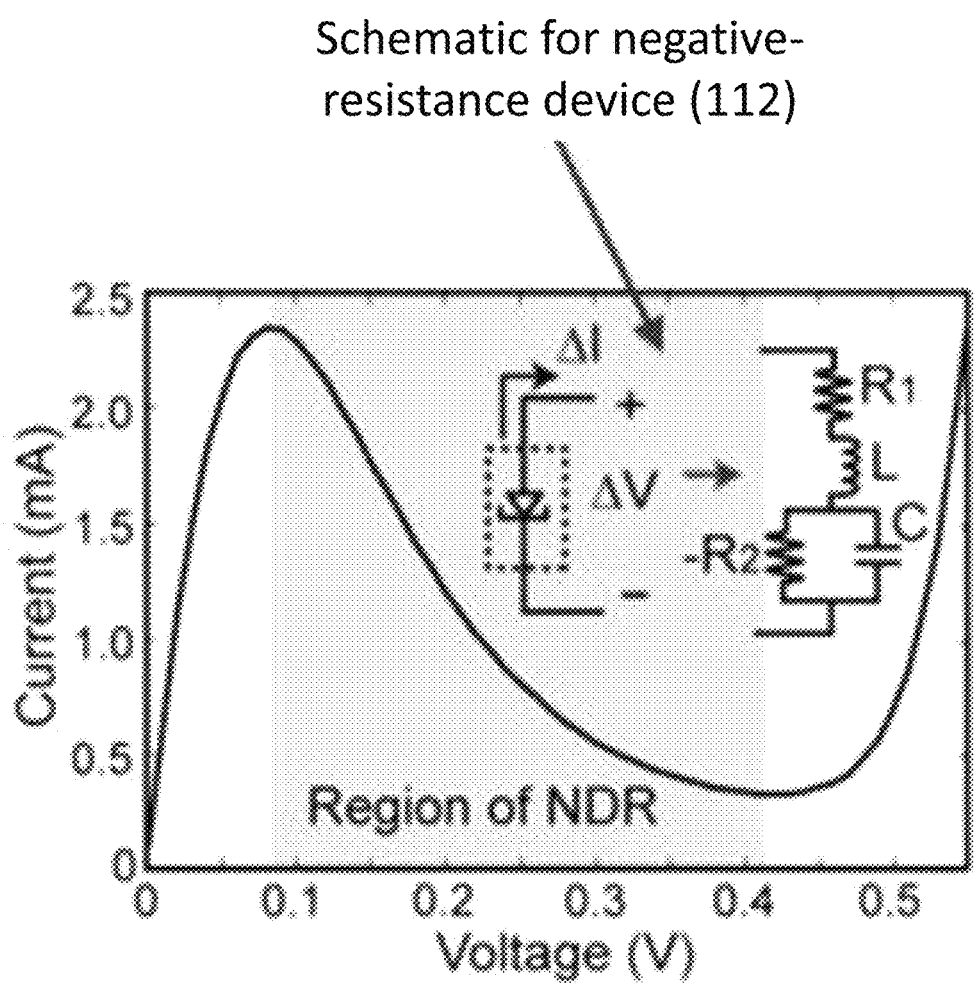
FIG. 2 shows an equivalent circuit model of the embedded TD (TD261 by General Electric) and its I-V curve. $R_p$, $L_p$ and $C_p$ are the parasitic resistance, inductance and capacitance of the TD, respectively

Referring now to FIGS. 1-6, the present invention features a novel microwave gain medium ("metamaterial") (100) having a negative refractive index. The metamaterial (100) may comprise a plurality of unit cells. In some embodiments, each unit cell (102) comprises: a substrate (104) upon which a metallic pattern (106) is printed, a split-ring resonator (SRR) (110) disposed on the metallic pattern (106), and one or more negative-resistance devices (112). A plurality of sub-wavelength wires may comprise the metallic pattern (106) and an aperture (108) may also be disposed thereon, Additional embodiments feature a negative-resistance device (112) disposed in the aperture (108) of the metallic pattern (106) for one or more unit cells. In further embodiments, a line (parallel to an applied electric field) comprises the metallic pattern (106).

Consistent with previous embodiments, an electromagnetic wave incident the metamaterial (100) may induce the plurality of sub-wavelength wires, the SRR (110), and the one or more negative-resistance devices (112) in each unit cell (102) to electromagnetically interface. The one or more negative-resistance devices (112) embedded in each unit cell (102) establish a negative resistance in the metamaterial (100) (while maintaining the negative refractive index). This effects a gain in the metamaterial (100), thus providing a spatial amplification of the (incident) wave.

In other embodiments, each unit cell may comprise a SRR (110) having a top end, a bottom end, a left end, and a right end; where the top end and the bottom end of the SRR (110) are affixed to the line of the metallic pattern (106), Further, each SRR (110) may have a first aperture disposed on the left end and a second aperture disposed on the right end. Some embodiments feature a negative-resistance device disposed in the first aperture of the SRR (110) for one or more unit cells. Alternate embodiments may feature a negative-resistance device disposed in the second aperture of the SRR (110) for one or more unit cells. In still other embodiments, for one or more unit cells, a negative-resistance device may be disposed in the first aperture (or alternately the second aperture) of the SRR (110) as well as in the aperture (108) of the metallic pattern (106).

In some embodiments, one or more of the plurality of negative-resistance devices (112) may be a diode or further, a quantum tunneling semiconductor device.

Figure 3:
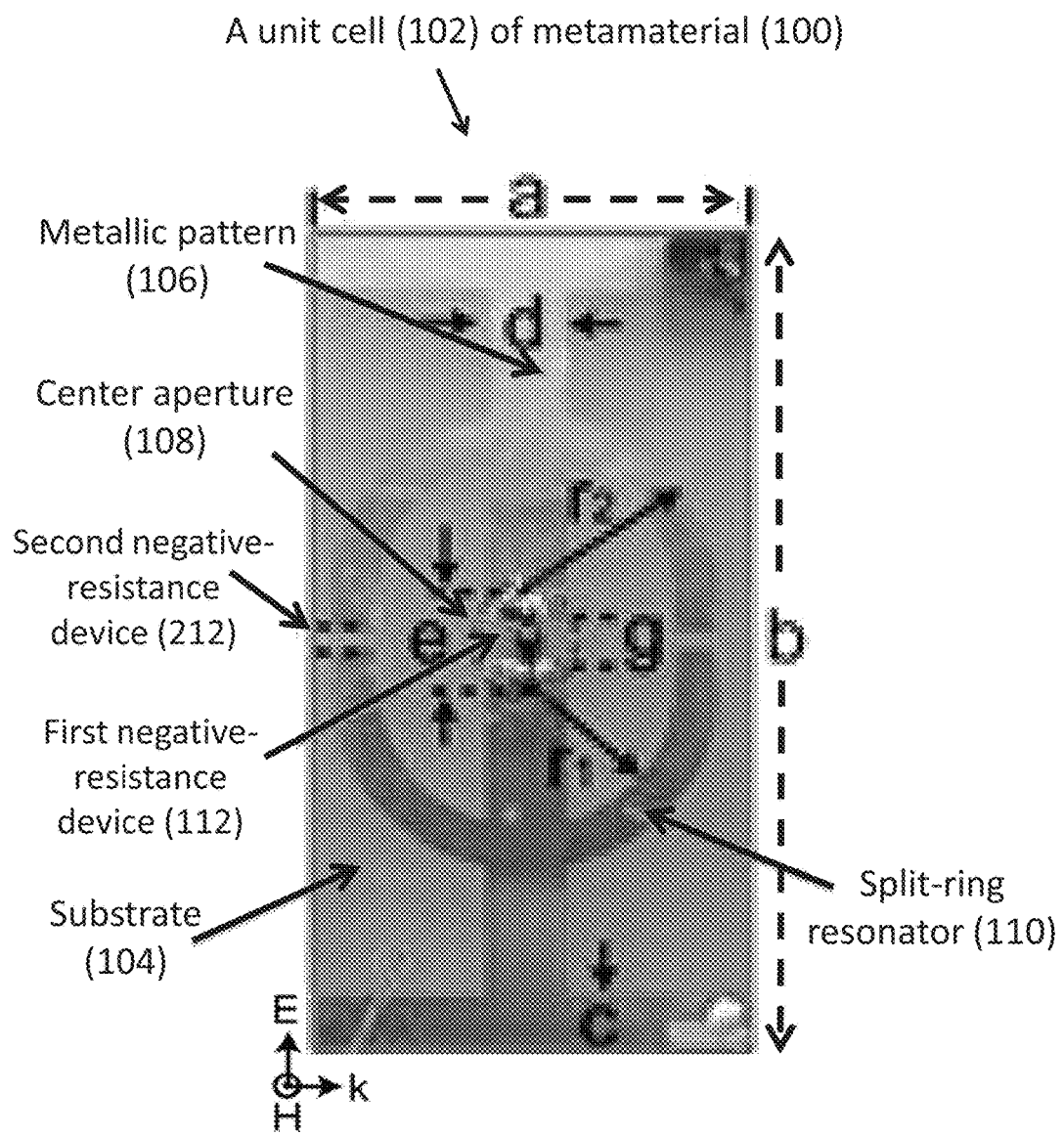
FIG. 3 shows a fabricated unit cell (tested sample structure) of the metamaterial with an embedded TD. Metallic patterns are printed on a 1.27-mm-thick Rogers-6006 substrate, whose dielectric constant is 6.5. Related dimensions are a=27 mm, b=54 mm, c=4 mm, d=5 mm, e=6 mm, f=0.8 mm, g=2.5 mm, $r_1$=9 mm, and $r_2$=12 mm.

The SRRs employed in the present invention may have any appropriate geometric form. To illustrate, the SRR may be circular-shaped, oval-shaped, triangular-shaped, rectangular-shaped, etc. Additionally, the metallic pattern may also have any appropriate shape comprising a line. To illustrate, FIG. 3 shows an I-shaped metallic pattern employed in a unit cell.

INVESTIGATIVE RESULTS

Volumetric negative index structures incorporating gain devices at microwave frequencies were investigated. Instead of separate sub-wavelength wire and SRR, thin metallic sub-wavelength wire and a SRR were combined to obtain low frequency electric and magnetic resonances in the same layer. The mid discontinuous metallic sub-wavelength wire lead to cylindrical dielectric resonator behavior exhibiting negative permittivity, where the SRR with two apertures (equivalent to a simple model of a displacement current ring) produced negative permeability. In a unit cell of the sub-wavelength wire and SRR, negative-resistance devices were inserted at the aperture of the sub-wavelength wire and/or SRR. If the negative-resistance device was inserted into the sub-wavelength wire, active (negative) permittivity resulted. If the negative-resistance device was inserted into the SRR, active (negative) permeability resulted. Negative-resistance devices inserted into both the sub-wavelength wire and SRR resulted in active (negative) permittivity and permeability.

Figure 4:
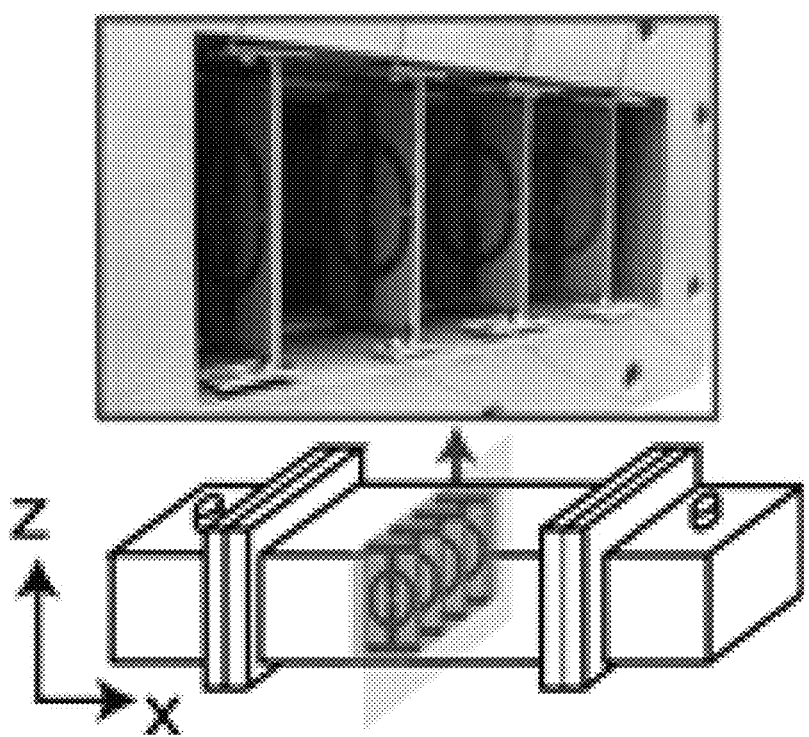
FIG. 4 shows a photograph (top) and schematic drawing (bottom) of the fabricated single layer sample (comprising the fabricated unit cells) placed in a standard WR-430 rectangular waveguide.
Figure 5:
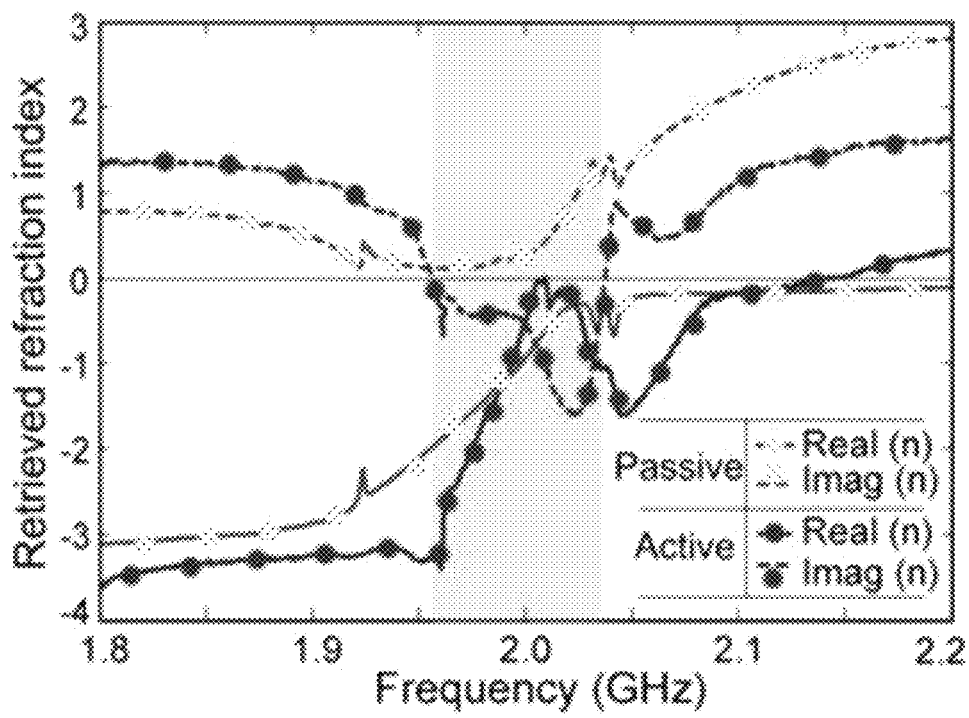
FIG. 5 shows the plot of refraction index vs. frequency for the fabricated single layer sample, with (active) and without (passive) an embedded negative-resistance device.
Figure 6:
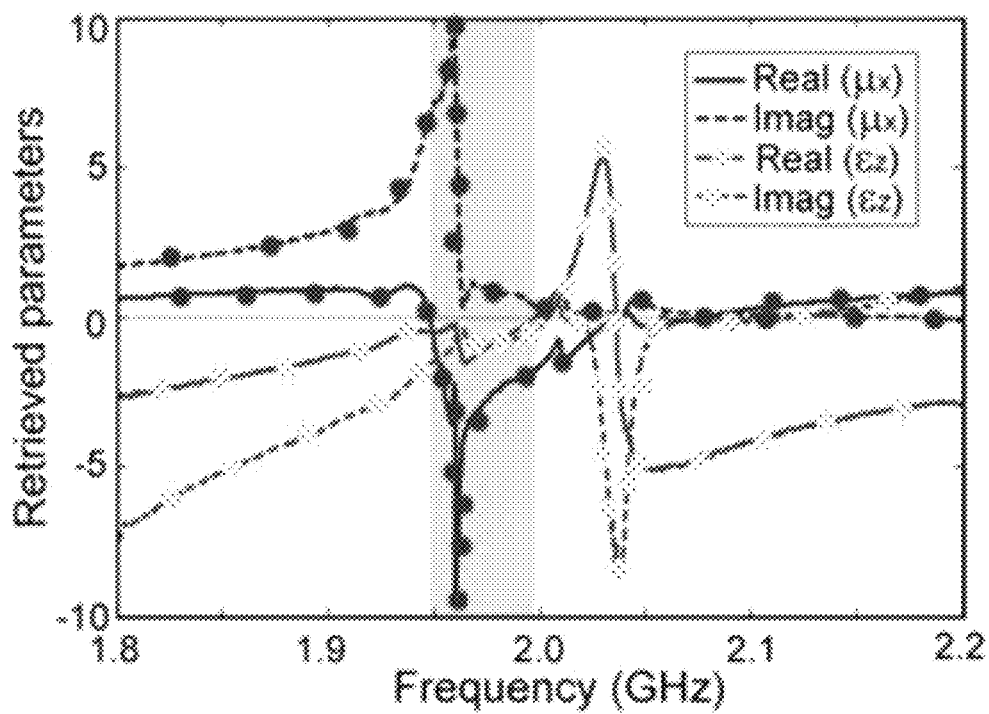
FIG. 6 shows the plot of permittivity ($\epsilon$)/permeability ($\mu$) vs. frequency for the fabricated single layer sample, with (active) and without (passive) an embedded negative-resistance device.

A test setup composed of four unit cells is shown in FIG. 4. The test setup was realized experimentally via a rectangular waveguide (a=109.22 mm, b=54.61 mm; operating in the standard mode in the frequency range of 1.8-2.2 GHz). The retrieved effective index of refraction of the active 3-D metamaterial and a passive sample (as reference) are plotted in FIG. 5. It can be observed that the active structure shows similar negative index of refraction as the passive sample, but possesses gain (as indicated by the negative imaginary component of the refraction index) in the frequency range from 1.95 to 2.04 GHz. This corresponds to the region of NDR within the negative-resistance device. Moreover, the measured permittivity in FIG. 6 unambiguously shows activeness (gain) in the electrical response as a result of the negative-resistance devices (indicated by the positive imaginary component of permittivity).

As used herein, the term "about" refers to plus or minus 10% of the referenced number.

Various modifications of the invention, in addition to those described herein, will be apparent to those skilled in the art from the foregoing description, Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

REFERENCES

Pendry, J. B. Negative refraction makes a perfect lens. Phys Rev Lett 85, 3966-3969 (2000).
Schurig, D., et al. Metamaterial electromagnetic cloak at microwave frequencies. Science 314, 977-980 (2006).
Fang, A., Koschny, T. & Soukoulis, C. M. Self-consistent calculations of loss-compensated fishnet metamaterials. Phys Rev B 82, 121102-121105 (2010).
Hamm, J. M., Wuestner, S., Tsakmakidis, K. L. & Hess, O. Theory of Light Amplification in Active Fishnet Metamaterials. Phys Rev Lett 107, 167405-167409 (2011).
Hess, O., Pendry, J. B., Maier, S. A., Oulton, R. F., Hamm, J. M. & Tsakmakidis, K. L. Active nanoplasmonic metamaterials. Nat Mater 11, 573-584 (2012).
Jiang, T., Chang, K. H., Si, L. M., Ran, L. X. & Xin, H. Active Microwave Negative-Index Metamaterial Transmission Line with Gain, Phys Rev Lett 107, 205503-205507 (2011).
Wuestner, S., Pusch, A., Tsakmakidis, K. L., Hamm, J. M. & Hess, O. Overcoming Losses with Gain in a Negative Refractive Index Metamaterial. Phys Rev Lett 105, 127401-127404 (2010).
Xiao, S. M., Drachev, V. P., Kildishev, A. V., Ni, X., Chettiar, U. K., Yuan, H. K. & Shalaev, V. M. Loss-free and active optical negative-index metamaterials. Nature 466, 735-U736 (2010). Hess, O. & Tsakmakidis, K. L. Metamaterials with Quantum Gain. Science 339, 654-655 (2013).
Chen, P. Y., Argyropoulos, C. & Alu, A. Broadening the Cloaking Bandwidth with Non-Foster Metasurfaces. Phys Rev Lett 111, 233001 (2013).
Xu, W. R., Padilla, W. J. & Sonkusale, S. Loss compensation in Metamaterials through embedding of active transistor based negative differential resistance circuits. Opt Express 20, 22406-22411 (2012).
Boardman, A. D., Rapoport, Y. G., King, N. & Malnev, V. N. Creating stable gain in active metamaterials. J Opt Soc Am B 24, A53-A61 (2007).
Yuan. Y., Popa, B. I. & Cummer, S. A. Zero loss magnetic metamaterials using powered active unit cells. Opt Express 17, 16135-16143 (2009).
Stockman, M. I, Criterion for negative refraction with low optical losses from a fundamental principle of causality. Phys Rev Lett 98, 177404 (2007).
Kinsler, P. & McCall, M. W. Causality-Based Criteria for a Negative Refractive Index Must Be Used With Care. Phys Rev Lett 101, 167401 (2008).
Stockman, M. I. Stockman replies. Phys Rev Lett 107, 259702 (2011).
Pendry, J. B. & Maier, S. A. Comment on "Spaser Action, Loss Compensation, and Stability in Plasmonic Systems with Gain". Phys Rev Lett 107, 259703 (2011).
Stockman, M. I. Spaser Action, Loss Compensation, and Stability in Plasmonic Systems with Gain. Phys Rev Lett 106, 156802 (2011).
Wuestner, S., Pusch, A., Tsakmakidis, K. L., Hamm, J. M. & Hess, O. Comment on "Spaser Action, Loss Compensation, and Stability in Plasmonic Systems with Gain", Phys Rev Lett 107, 259701 (2011).
Capua, A., Karni, O., Eisenstein, G., Reithmaier, J. P. & Yvind, K. Extreme nonlinearities in InAs/InP nanowire gain media: the two-photon induced laser. Opt Express 20, 5987-5992 (2012).
Kemp, A. J., Maclean, A. J., Hopkins, J. M., Hastie, J. E., Calvez, S., Dawson, M. D. & Burns, D. Thermal management in disc lasers: doped-dielectric and semiconductor laser gain media in thin-disc and microchip formats. J Mod Optic 54, 1669-1676 (2007).
Paschotta, R. Laser Gain Media: A Diverse Family of Materials. Photonic Spectra 47, 57-60 (2013).
Pirri, A., Toci, G. & Vannini, M. Characterization and comparison of 1% at Yb-doped Lu2O3 and Sc2O3 ceramics as laser gain media. Laser Phys 22, 1851-1855 (2012).
Tanaka, M., Nishikino, M., Kawachi, T., Hasegawa, N., Kado, M., Kishimoto, M., Nagashima, K. & Kato, Y. X-ray laser beam with diffraction-limited divergence generated with two gain media. Opt Lett 28, 1680-1682 (2003).

What is claimed is:

1. A microwave gain medium (100) having a negative refractive index adapted to be placed in a rectangular waveguide to form a volumetric structure, the medium (100) comprising:
   (a) a unit cell (102) comprising a substrate (104);
   (b) a linear sub-wavelength wire (106) printed on the substrate (104) of the unit cell (102);
   (c) a circular-shaped split ring resonator (110) printed on the substrate (104) of the unit cell (102), the circular-shaped split ring resonator (110) overlays the linear sub-wavelength wire (106);
   (d) a first negative resistance device (112) being embedded at a horizontal symmetry axis of the linear sub-wavelength wire (106), which causes the sub-wavelength wire (106) to exhibit a negative permittivity;
   (e) a second negative resistance device (212) being embedded at an opposite end of a split point on the split ring resonator (110), which causes the split ring resonator (110) to exhibit a negative permeability;
   wherein a microwave incident on the medium (100) induces the sub-wavelength wire (106), the split ring resonator (110), and the first and second negative resistance devices (212) in the unit cell (102) to electromagnetically interface, which effects a gain in the medium (100), thus providing a spatial amplification of the incident microwave, while the medium (100) maintains a negative refractive index, thereby eliminating an energy loss.

2. The medium (100) of claim 1, wherein the substrate (104) has a thickness of 1.27 mm, a width of 27 mm, a length of 54 mm;
   wherein a first part of the linear sub-wavelength wire (106) is at a first end of the substrate (104) and the first part has a width of 4 mm; a second part of the linear sub-wavelength wire (106) is at a second end of the substrate (104) and the second part has a width of 4 mm; a third part of the linear sub-wavelength wire (106) is parallel to the length direction of the substrate (104) and is at a middle of the width direction of the substrate (104), and the third part has a width of 5 mm; the first negative resistance device is embedded at the horizontal symmetry axis of the linear sub-wavelength wire (106);
   wherein a center of the circular-shaped split ring resonator is at a centroid of the substrate (104); an outer radius of the circular-shaped split ring resonator is 12 mm; an inner radius of the circular-shaped split ring resonator is 9 mm; the split point on the split ring resonator (110) is directly to the right of the horizontal symmetry axis of the sub-wavelength wire (106); the second negative resistance device is embedded at an opposite end of the split point on the split ring resonator (110).

3. The medium (100) of claim 1, wherein the first negative resistance device (112) is a tunneling diode or a quantum tunneling semiconductor device.

4. The medium (100) of claim 1, wherein the second negative resistance device (212) is a tunneling diode or a quantum tunneling semiconductor device.

5. The medium (100) of claim 1, wherein the sub-wavelength wire (106) is metallic.

6. The medium (100) of claim 1, wherein the split ring resonator (110) is metallic.

* * * * *